United States Patent [19]

Gray

[11] Patent Number: 5,723,974
[45] Date of Patent: Mar. 3, 1998

[54] MONOLITHIC POWER CONVERTER WITH A POWER SWITCH AS A CURRENT SENSING ELEMENT

[75] Inventor: Richard L. Gray, Alameda, Calif.

[73] Assignee: Elantec Semiconductor, Inc., Milpitas, Calif.

[21] Appl. No.: 561,304

[22] Filed: Nov. 21, 1995

[51] Int. Cl.$^6$ .................................................. G05F 1/56
[52] U.S. Cl. ........................................ 323/282; 323/907
[58] Field of Search ............................... 323/282, 284, 323/285, 907

[56] References Cited

U.S. PATENT DOCUMENTS 3,961,208   6/1976   Khanna ........................... 323/907
5,229,709   7/1993   Pfennings ........................ 323/282
5,237,262   8/1993   Ashley ............................. 323/284
5,488,288   1/1996   Elmer .............................. 323/907

*Primary Examiner*—Matthew V. Nguyen
*Attorney, Agent, or Firm*—Fliesler, Dubb, Meyer & Lovejoy

[57] ABSTRACT

A monolithic power control circuit is disclosed that includes a switching element and a control circuit that senses a voltage drop across the switching element and that adjusts a duty cycle of the switching element. The monolithic circuit includes a compensation circuit that adjusts a contribution of the sensed voltage drop across the switching element in response to temperature changes of the switching element.

10 Claims, 5 Drawing Sheets

MONOLITHIC POWER CONVERTER WITH A POWER SWITCH AS A CURRENT SENSING ELEMENT

BACKGROUND OF THE INVENTION

1. Field of the Invention

The present invention pertains to the field of power control circuits. More particularly, this invention relates to a power converter circuit that senses output current through an output power switching element.

2. Art Background

Electronic systems commonly contain elements or components that require differing levels of electrical supply voltage. For example, computer systems commonly contain integrated circuit devices such as processor chips and memory chips that require differing levels of direct current (DC) supply voltage. Such computer systems typically include devices that require a 5 volt DC supply voltage. Such computer systems also commonly contain integrated circuit devices that require lower supply voltages such as 2.9 volts DC or 3.3 volts DC.

Such prior electronic systems usually include power control circuitry that converts between such differing voltage supply levels. For example, one type of prior power control circuit converts a 5 volt DC supply voltage into a lower level supply voltage such as 3.3 volts DC. Such a power control circuit may be referred to as a voltage-to-voltage step-down converter or a "buck" converter.

Such prior voltage converters typically include a power switch that drives an inductor-capacitor (LC) filter as well as control circuitry that controls the on-off duty cycle of the power switch. Typically, such an LC filter provides the desired output voltage level according to the duty cycle of the power switch. Typically, the control circuitry for such a voltage converter adjusts the duty cycle for the power switch by sensing levels of current in the inductor of the LC filter as well as the output voltage across the capacitor and adjusting the duty cycle of the power switch as required.

Prior voltage converters usually sense the inductor current levels in the LC filter by providing a resistive element in the LC output filter. Typically, the control circuitry in such a voltage converter senses the voltage drop across the resistive element to determine inductor current levels. Unfortunately, such a resistive element usually decreases the overall efficiency of such a voltage converter through $I^2R$ power losses. In addition, such resistive elements typically increase the overall component costs of such voltage converters and increase the manufacturing complexity and the form factors for such voltage converters.

SUMMARY AND OBJECTS OF THE INVENTION

One object of the present invention is to provide a power converter circuit that does not require a power draining resistive element for sensing output current levels.

Another object of the present invention is to provide power control using a monolithic integrated circuit that includes on-chip power switching elements.

A further object of the present invention is to provide a power converter circuit that senses output current by measuring a voltage drop across the power switching element.

Another object of the present invention is to sense the voltage drop across the power switching element while compensating for resistance changes caused by temperature or processing variations of the power switching element.

A further object of the present invention is to provide power control using a monolithic integrated circuit device suitable for placement in close proximity to integrated circuits that require precise control of voltage supply levels.

These and other objects are provided by a monolithic power control circuit that includes a switching element that drives an output filter circuit and a control circuit that senses a voltage drop across the switching element. The control circuit adjusts a duty cycle of the switching element according to the voltage drop across the switching element and an output voltage error indication. The monolithic circuit includes a compensation circuit that adjusts a contribution of the sensed voltage drop across the switching element in response to temperature changes and/or processing variations of the switching element.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
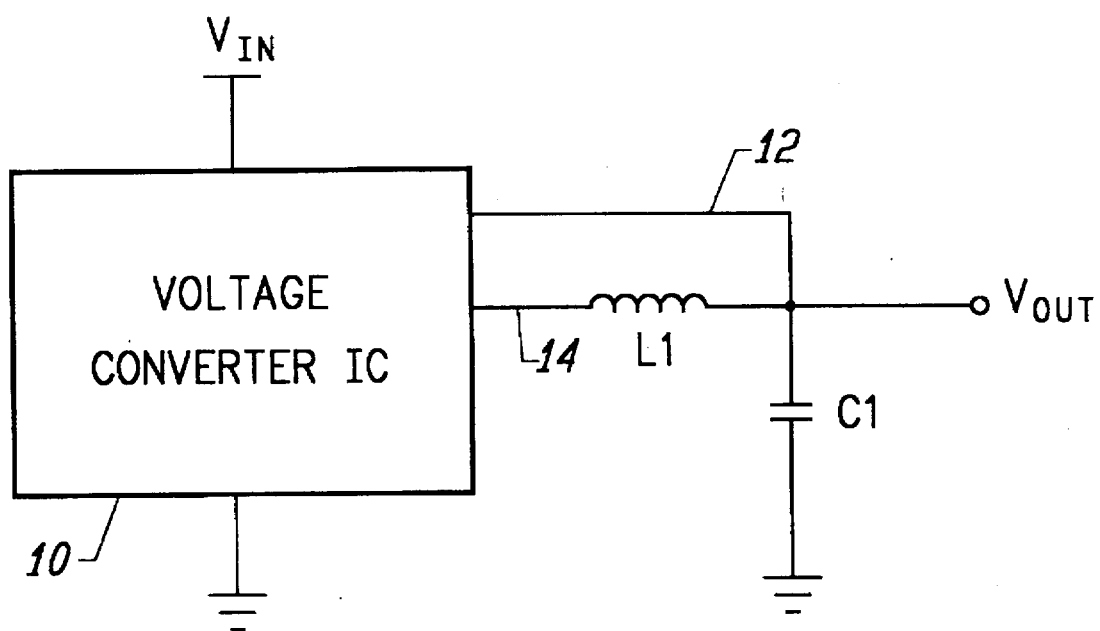
FIG. 1 illustrates a power converter circuit for one embodiment which includes a monolithic integrated circuit and an LC circuit.

FIG. 1 illustrates a power converter circuit for one embodiment. The power converter circuit includes a voltage converter 10, an inductor L1 and a capacitor C1. The voltage converter 10 is implemented as a monolithic integrated circuit (IC) device.

The voltage converter 10 generates a varying output voltage at a node 14. The node 14 is coupled to an output filter LC circuit comprising the inductor L1 and the capacitor C1. The LC circuit filters the output supply current on node 14 and provides a substantially stable output voltage VOUT at an output node 12.

For one embodiment, the voltage converter 10 is supplied with an input voltage VIN substantially equal to 5 volts DC and generates an output voltage VOUT substantially equal to 3.3 volts DC. As such, the power converter shown may be referred to as a buck converter or a step-down voltage converter.

Figure 2:
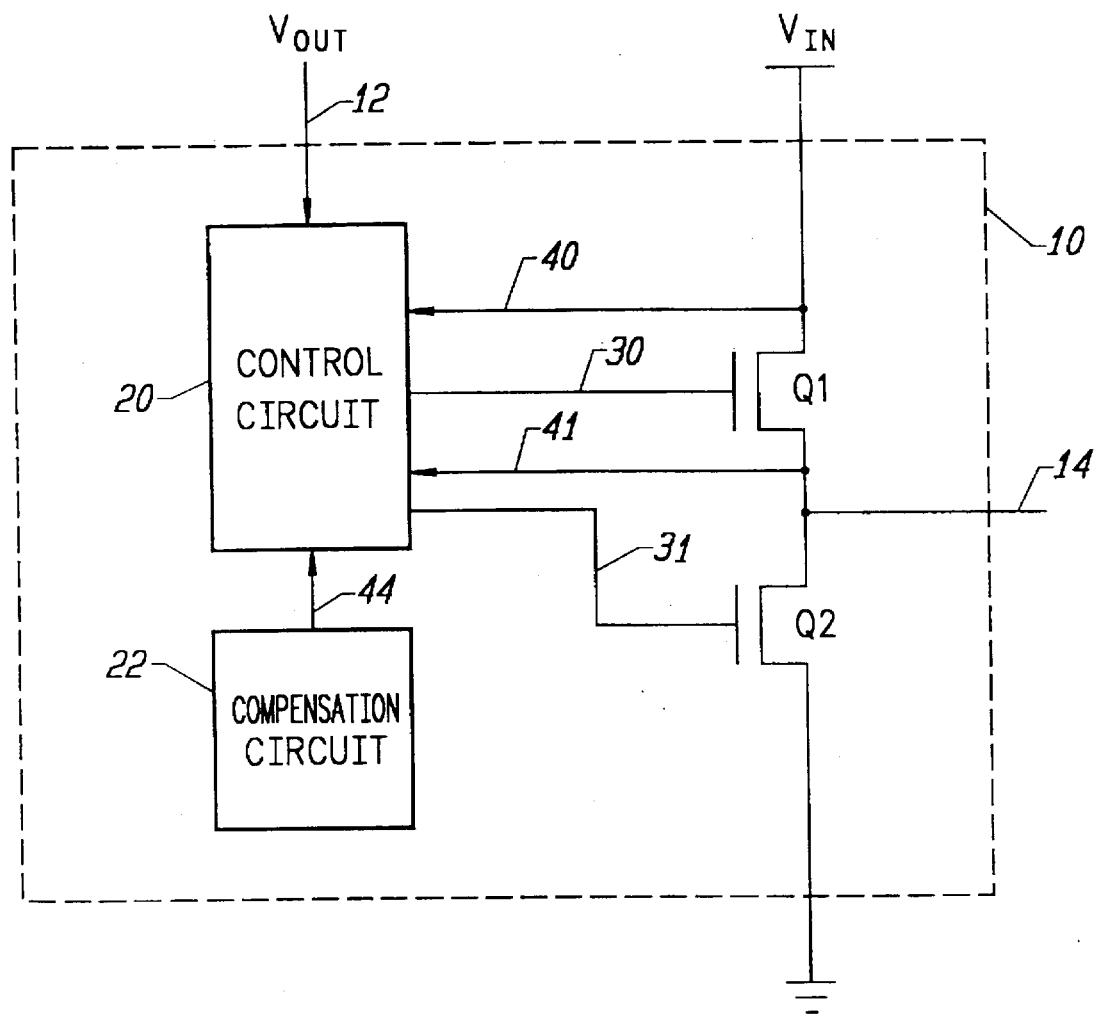
FIG. 2 illustrates the circuitry contained on the monolithic integrated circuit including a pair of power transistors, a control circuit, and a compensation circuit.

FIG. 2 illustrates the circuitry contained on the voltage converter IC 10. The voltage converter IC 10 contains a pair of power transistors Q1 and Q2. The voltage converter IC 10 also contains a control circuit 20 and a compensation circuit 22. For one embodiment, the power transistors Q1 and Q2 are each implemented as metal oxide semiconductor field effect transistors (MOSFETs).

The transistor Q1 functions as a power switching element for generating the varying output supply current at the node 14. The on-off duty cycle of the transistor Q1 is controlled by the control circuit 20. The control circuit 20 generates an output control signal 30 that switches on and off the transistor Q1 to drive the LC circuit at the node 14. The control circuit 20 also controls the transistor Q2 which in this arrangement functions as a power diode that allows unidirectional electrical flow between the node 14 and a common node. In typical operation Q2 is off when Q1 is on and vice versa.

The control circuit 20 determines the appropriate on-off duty cycle for the transistor Q1 by sensing the output voltage VOUT at the output node 12 and by sensing a voltage drop across the transistor Q1 via a pair of signal lines 40 and 41. The control circuit 20 uses the voltage drop sensed via the signals 40 and 41 to determine the inductor current levels for the LC circuit at the node 14. The control circuit 20 uses the inductor current level at the LC circuit in combination with the sensed and the desired level of output voltage VOUT to precisely control the on-off switching intervals of the transistor Q1 and provide the desired level of output voltage VOUT.

The compensation circuit 22 generates a compensation signal 44 for the control circuit 20. The control circuit 20 uses the compensation signal 44 to adjust the sensed level of voltage drop across the transistor Q1 as the operating temperature of the voltage converter 10 varies. The compensation signal 44 indicates changes in the resistance of the transistor Q1 as the temperature of the monolithic voltage converter IC 10 changes.

Figure 3:
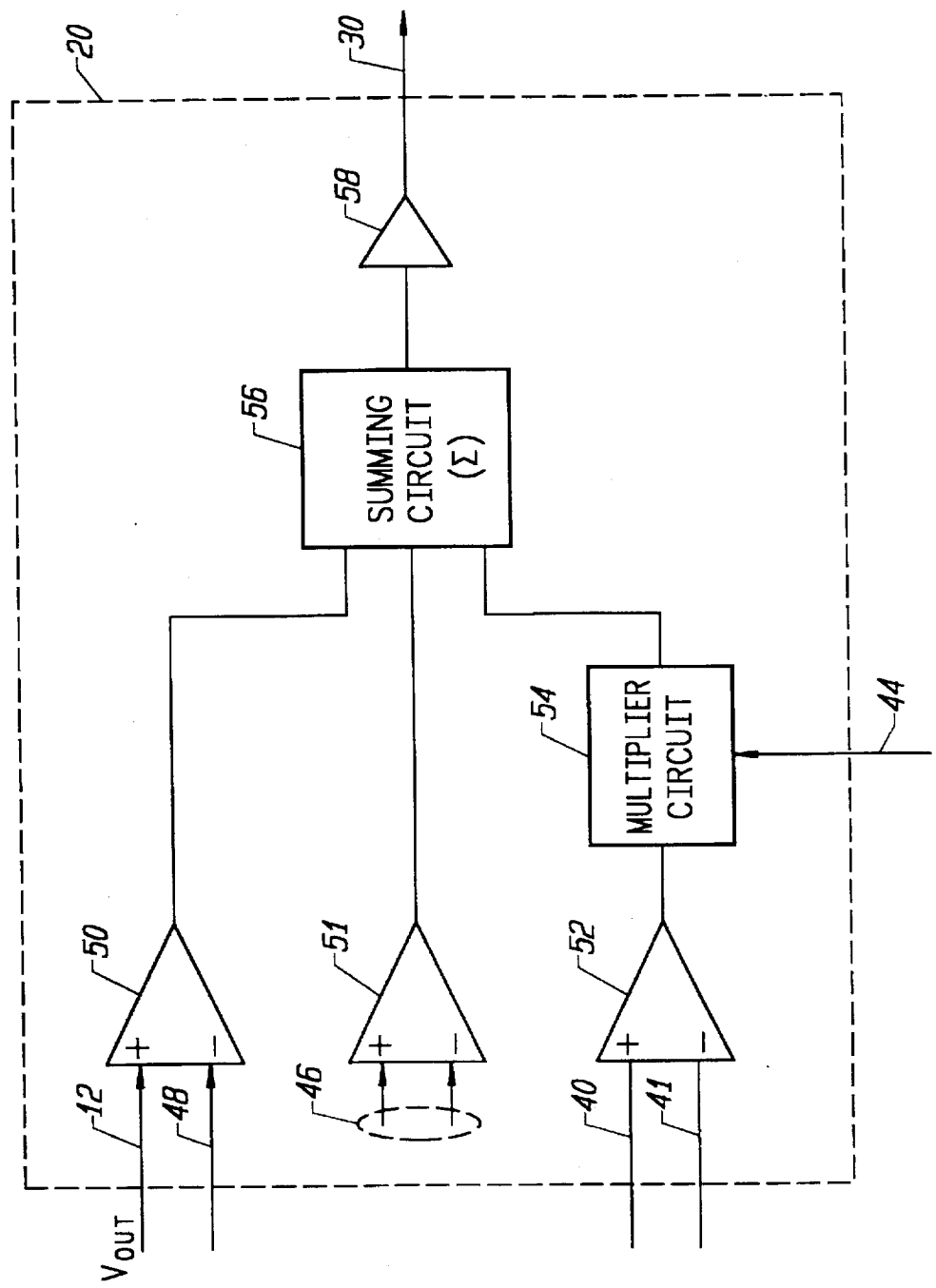
FIG. 3 illustrates the control circuit which includes comparator circuitry comprising a set of differential input stages and a summing circuit, and which further includes a multiplier circuit.

FIG. 3 illustrates the control circuit 20 for one embodiment. The control circuit 20 includes a set of differential input stages 50–52 along with a multiplier circuit 54, a summing circuit 56, and an output driver circuit 58. The outputs of the differential stages 50–52 are combined in the summing circuit 56 which provides a pulsed wave output control signal 30. The circuitry shown taken together functions as a comparator circuit between the inputs to the differential input stages 50–52 and provides the output control signal 30 which drives the LC output filter circuit comprising L1 and C1.

The differential input stage 50 senses an attenuated voltage level of the output node 12 and a desired voltage level for the output node 12 which is indicated on a signal line 48. The output of the differential stage 50 provides an error signal to the summing circuit 56 that indicates differences between actual output voltage VOUT and the desired output voltage for the output node 12. The differential input stage 52 senses the voltage drop across switching transistor Q1 via the signal lines 40 and 41. The voltage drop sensed via the signal lines 40 and 41 indicates the inductor current into the LC output filter according to an IR relation where R is the internal resistance of the transistor Q1.

The compensation signal 44 provides a gain adjust input signal for the multiplier circuit 54. The multiplier circuit 54 modulates the output of the differential stage 52 with the compensation signal 44. The compensation signal 44 causes the multiplier circuit 54 to adjust the contribution of the sensed voltage drop across the transistor Q1 to the summing circuit 56.

The compensation signal 44 adjusts the contribution of the sensed voltage drop across the transistor Q1 to the comparator function in the control circuit 20 as the internal resistance of the transistor Q1 changes with temperature changes. For example, the internal resistance of the transistor Q1 increases as the temperature of the monolithic integrated circuit 10 including the transistor Q1 increases. The increase of internal resistance in the transistor Q1 causes the differential stage 52 to sense an increased voltage drop across the transistor Q1. The compensation signal 44 under such conditions causes the multiplier circuit 44 to reduce the contribution of the differential input stage 52 to the summing circuit 56.

The differential input stage 51 is included in one embodiment. The differential input stage 51 is driven by a slope compensation signal 46. The slope compensation signal 46 in an embodiment is a sawtooth wave form that is internally generated by circuitry (not shown) within the voltage converter 10. The slope compensation signal 46 enhances the stability of the output control signal 30 which drives the transistor Q1.

Figure 4:
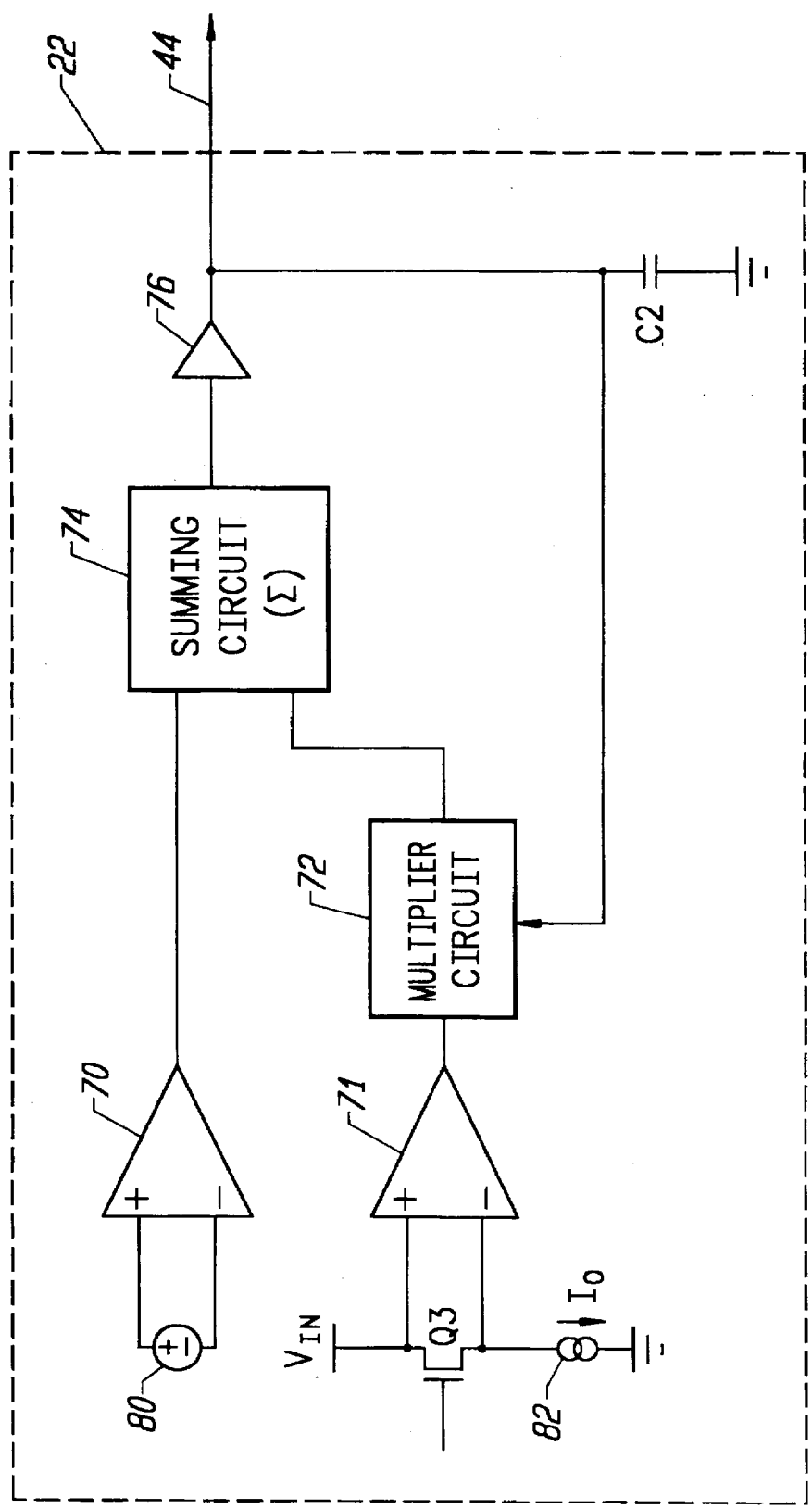
FIG. 4 illustrates the compensation circuit which includes amplifier circuitry comprising a pair of differential input stages and a summing circuit, and which further includes a dummy switching transistor and a multiplier circuit.

FIG. 4 illustrates the compensation circuit 22 for one embodiment. The compensation circuit 22 includes a pair of differential input stages 70 and 71, a multiplier circuit 72, a summing circuit 74, a gain stage 76, and a capacitor C2. The compensation circuit 22 also includes a transistor Q3 coupled in series with an electrical current supply 82.

The transistor Q3 serves as a dummy switching transistor that reflects internal resistance changes in the transistor Q1, the real switching transistor, as the operating temperature of the voltage converter 10 changes. Since the construction is monolithic the dummy and real switching transistors also track each other over process variations. The physical dimensions for the dummy switching transistor Q3 and the level Io of the electrical current supply 82 are scaled down to mimic the ratio of the physical dimensions of the real switching transistor Q1 to the output current through the real switching transistor Q1.

The circuitry shown for the compensation circuit 22 taken together provides a comparator function between a sensed voltage drop across the dummy transistor Q3 and a fixed voltage source 80. The voltage source 80 provides a predetermined voltage input to the differential input stage 70. The multiplier circuit 72 equalizes the contributions of the constant voltage source 80 and the voltage drop across the dummy transistor Q3 and provides the compensation signal 44 that indicates temperature variations in the integrated circuit 10. As the internal resistance of the real switching transistor Q3 increases with increasing temperature of the integrated circuit device 10, the compensation signal 44 causes the multiplier circuit 72 to reduce the contribution of the voltage drop across the dummy switching transistor Q3. The compensation signal 44 accordingly controls the gain adjust for both the multiplier circuit 72 and the multiplier circuit 54 which controls the contribution of the voltage drop across the power transistor Q1 to the comparator function of the control source 80.

Figure 5:
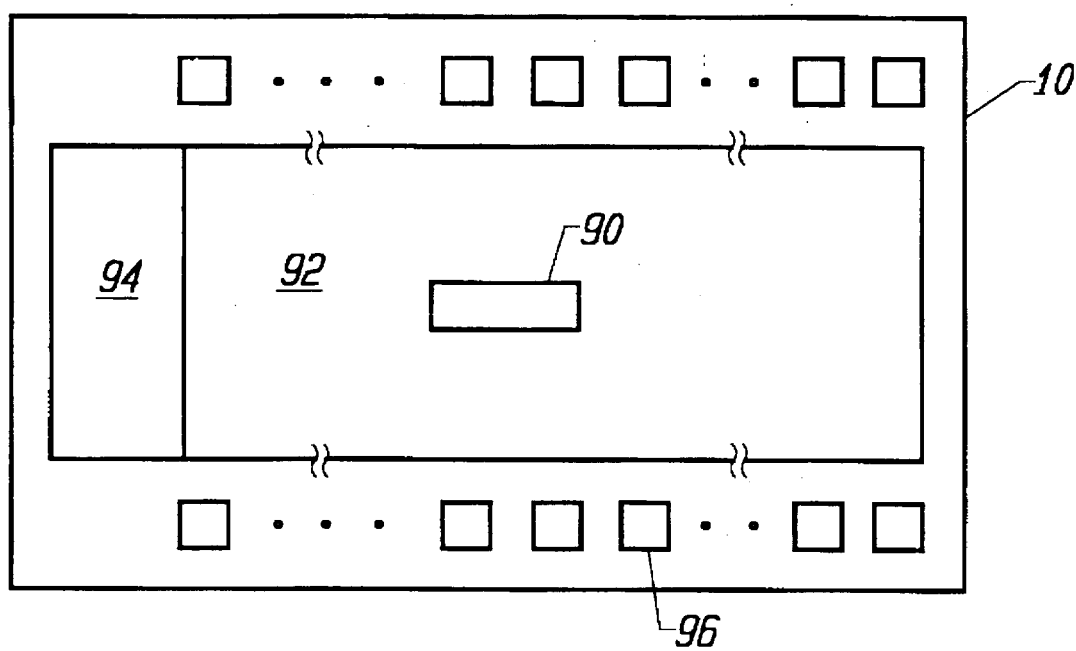
FIG. 5 illustrates a physical layout of the monolithic integrated circuit that enhances temperature compensation tracking with the dummy switching transistor.

FIG. 5 illustrates the physical layout of the voltage converter integrated circuit 10 in one embodiment. The voltage converter IC 10 is a monolithic integrated circuit device implemented on a substrate that includes a control circuit area 94, a power transistor area 92, a dummy switching transistor area 90, as well as input/output wire-bond pads 96. The output transistors Q1 and Q2 are each implemented in the power transistor area 92 as segmented power transistors.

The dummy switching transistor Q3 is implemented in the area 90 and is subject to substantially the same temperature variation as the real switching transistor Q1. The placement of the dummy transistor Q3 in the area 90 avoids temperature compensation errors that might otherwise occur if the dummy transistor were placed on a peripheral area of the integrated circuit 10. Such errors could occur as temperature gradients develop across the surface of the integrated surface device 10.

The placement of the dummy transistor Q3 in the area 90 insures that internal resistance temperature variation of the dummy switching transistor Q3 substantially matches the internal resistance temperature variation of the real switching transistor Q1 as the operating temperature of the integrated circuit device 10 varies.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A monolithic power control circuit, comprising:
   a power switching transistor that provides a voltage to drive an input node of a filter circuit;
   a control circuit that senses a voltage drop across the power switching transistor and that provides a control signal to the power switching transistor that adjusts a duty cycle of the power switching transistor according to a contribution of the voltage drop across the power switching transistor and a difference in a voltage from an output node of the filter circuit and a predetermined voltage value; and
   a compensation circuit providing a compensation signal to the control circuit to enable the control circuit to adjust the contribution of the voltage drop across the power switching transistor so that the control signal modulates the duty cycle of the power switching transistor element in response to temperature changes of the power switching transistor.

2. The monolithic power control circuit of claim 1, wherein the compensation circuit includes a dummy power switching transistor having an internal resistance that proportionally mimics changes in an internal resistance of the power switching transistor, wherein the dummy power switching transistor is coupled to provide the compensation signal to cause the control circuit to adjust the contribution of the voltage drop across the power switching transistor to compensate for changes in the internal resistance of the power switching transistor due to the temperature changes.

3. The monolithic power control circuit of claim 2, wherein the compensation circuit comprises:
   a first comparator having inputs receiving a voltage drop across the dummy power switching transistor, and having an output;
   a second comparator having connected to a voltage source, and having an output;
   a multiplier circuit having an input coupled to the output of the first comparator, and having a gain adjust input and an output;
   a summing circuit having a first input connected to the output of the second comparator, a second input connected to the output of the multiplier circuit, and an output coupled to provide the compensation signal; and
   a capacitor having a first terminal coupled to the gain adjust input of the multiplier circuit and to receive the compensation signal, and having a second terminal connected to a common node.

4. The monolithic power control circuit of claim 2, wherein the control circuit comprises:

a first comparator having inputs receiving the voltage drop across the power switching transistor, and having an output;
a multiplier circuit having an input coupled to the output of the first comparator, a gain adjust input coupled to receive the compensation signal from the compensation circuit, and having an output;
a second comparator having a first input connected to the input of the filter circuit, a second input connected to a reference voltage, and having an output; and
a summing circuit having a first input coupled to the output of the multiplier circuit, a second input coupled to the output of the second comparator and an output coupled to provide the control signal that adjusts the duty cycle of the power switching transistor.

5. The monolithic power control circuit of claim 2, wherein the dummy power switching transistor is contained within an area of a substrate containing the power switching transistor such that temperature in the power switching transistor matches temperature in the dummy power switching transistor.

6. A monolithic power control circuit, comprising:
   a power switching transistor having a source to drain path connected to an input node of a filter circuit, and having a gate;
   a control circuit having an input that receives the voltage from an output node of the filter circuit and provides a control signal to the gate of the power switching transistor, the control signal adjusting a duty cycle of the power switching transistor according to a variation of the voltage at the output node of the filter circuit from a predetermined voltage value; and
   compensation circuit comprising:
      a dummy power switching transistor having a source to drain path coupled to provide a compensation signal to the control circuit so that the control circuit further adjusts the control signal so that the duty cycle of the power switching transistor is adjusted to compensate for changes in internal resistance of the power switching transistor due to temperature changes.

7. The monolithic power control circuit of claim 6 wherein the control circuit further has inputs connected to the source and the drain of the power switching transistor to receive a voltage drop across the power switching transistor, wherein the voltage drop across the power switching transistor is adjusted by the compensation signal and summed with the difference between the voltage received from the output node of the filter circuit and the predetermined voltage value to provide the control signal to the gate of the power switching transistor.

8. The monolithic power control circuit of claim 7, wherein the control circuit comprises:
   a first comparator having inputs connected to the source and the drain of the power switching transistor to receive the voltage drop across the power switching transistor, and having an output;
   a multiplier circuit having an input coupled to the output of the first comparator, a gain adjust input coupled to receive the compensation signal from the compensation circuit, and having an output;
   a second comparator having a first input coupled to the output node of the filter circuit, a second input connected to receive the predetermined voltage value, and having an output; and
   a summing circuit having a first input coupled to the output of the multiplier circuit, a second input coupled to the output of the second comparator and an output coupled to provide the control signal to the gate of the power switching transistor.

9. The monolithic power control circuit of claim 8 wherein the compensation circuit further comprises:

a first comparator having inputs connected to the source and the drain of the dummy power switching transistor, and having an output;

a second comparator having inputs connected to a voltage source, and having an output;

a multiplier circuit having an input coupled to the output of the first comparator, and having a gain adjust input and an output;

a summing circuit having a first input connected to the output of the second comparator, a second input connected to the output of the multiplier circuit, and an output coupled to provide the compensation signal; and a capacitor having a first terminal coupled to the gain adjust input of the multiplier circuit and to receive the compensation signal, and having a second terminal connected to a common node.

10. The monolithic power control circuit of claim 9, wherein the dummy power switching transistor is contained within an area of a substrate containing the power switching transistor such that temperature in the power switching transistor matches temperature in the dummy power switching transistor.

* * * * *